United States Patent
Brandt

(10) Patent No.: US 6,326,846 B1
(45) Date of Patent: Dec. 4, 2001

(54) LOW VOLTAGE FET DIFFERENTIAL AMPLIFIER AND METHOD

(75) Inventor: Brian Paul Brandt, Windham, NH (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/547,353

(22) Filed: Apr. 11, 2000

(51) Int. Cl.[7] ....................................... H03F 3/45
(52) U.S. Cl. ............................. 330/253; 330/261; 330/51
(58) Field of Search ................................. 330/261, 253, 330/51; 327/52

(56) References Cited

U.S. PATENT DOCUMENTS 4,710,724 * 12/1987 Connell et al. ........................... 330/9
4,785,259 * 11/1988 Seelbach et al. ..................... 330/300
5,021,745 * 6/1991 Kondou et al. ...................... 330/253
5,936,466 * 8/1999 Andoh et al. ........................ 330/253

* cited by examiner

*Primary Examiner*—Robert Pascal
*Assistant Examiner*—Henry Choe
(74) *Attorney, Agent, or Firm*—Girard & Equitz LLP

(57) ABSTRACT

A differential amplifier and method including a differential pair of input MOS transistors coupled to a common tail current source and a pair of MOS load transistors, with the amplifier outputs being disposed intermediate the input and load transistors. Biasing circuitry is included to maintain the load transistors in the linear region of operation. Reset transistors can be used to periodically reset the amplifier by connecting the outputs directly to the inputs.

32 Claims, 4 Drawing Sheets

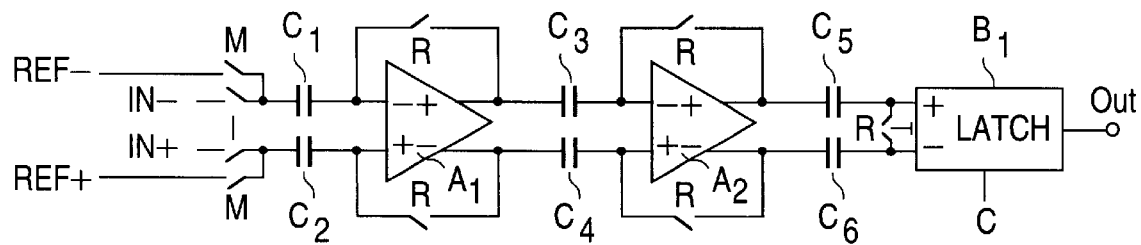
FIG. 1
(PRIOR ART)
FIG. 2A
(PRIOR ART)
Clk
FIG. 2B
(PRIOR ART)
R
FIG. 2C
(PRIOR ART)
I
FIG. 2D
(PRIOR ART)
M
FIG. 2E
(PRIOR ART)
C

US 6,326,846 B1

LOW VOLTAGE FET DIFFERENTIAL AMPLIFIER AND METHOD

FIELD OF THE INVENTION

The present invention relates generally to differential amplifiers and in particular to FET differential amplifiers capable of providing good performance at reduced supply voltages.

DESCRIPTION OF RELATED ART

Many data conversion circuits, including Analog-To-Digital Converters and Digital-To-Analog Converters, operate utilizing comparator circuitry which includes fully differential amplifiers. FIG. 1 is a diagram of a conventional fully differential comparator circuit which provides a comparator output Out indicative of the relative magnitude of an analog input having a positive component IN+ and a negative component IN− and a reference having a positive component REF+ and a negative component REF−.

The FIG. 1 comparator circuit including two fully differential amplifiers A1 and A2 which drive a regenerative latch circuit B1. FIGS. 2A, 2B, 2C, 2D and 2E are timing diagrams of timing signals Clk, R, I, M and C, respectively, for controlling operation of the FIG. 1 comparator circuit. When signal Clk is high, timing signal R (FIG. 2B) is active so that the switches associated with signal R will be turned on. This will cause the inverting input and the non-inverting input of each amplifier A1 and A2 to be connected directly to the non-Attorney inverting and inverting output, respectively, of each amplifier. This causes the closed loop gain of amplifiers A1 and A2 to be unity, with the amplifier inputs (and outputs) being at the threshold voltage of each amplifier. In addition, signal R will short the inputs of latch circuit B1 together.

Timing signal I (FIG. 2C) is also active when Clk is high so that the negative component of the differential analog signal being compared, IN−, is coupled to input capacitor C1 and the positive component IN+ is coupled to input capacitor C2. At this point, capacitors C1 and C2 have a stored voltage that corresponds to the magnitude of the analog inputs IN− and IN+. Capacitors C3 and C4 will have a stored voltage that corresponds to the magnitude of the difference between threshold voltages of amplifiers A1 and A2.

When clock Clk goes low, signals R and I go inactive followed by signal M going active. Among other things, this causes the switches shorting the amplifier inputs to the outputs to open. The amplifiers A1 and A2 are thus operating open loop. In addition, input capacitor C1 is coupled to reference voltage Ref− and input capacitor C2 is coupled to reference voltage component Ref+. Thus, the change in voltage at the inverting input of amplifier A1 will be the difference between the magnitude of reference voltage Ref− and input IN− and the change in voltage at the non-inverting input will be the difference in magnitude of reference voltage Ref+ and IN+.

The differences will be amplified by amplifier A1, with the output being proportional to the difference between input IN+/IN− and Ref+/Ref−. Amplifier A2 functions to amplify the difference voltage further. Finally, just as clock Clk goes high, and before signals R and I become active again, signal C goes active thereby latching the difference voltage presented at the inputs of the latch circuit B1. The digital output of latch circuit B1 will be either a "1", or a "0" depending upon the relative magnitudes of IN+/IN− and Ref+/Ref−.

The gain of the differential amplifiers A1 and A2 are each typically 5–20. The gain of these cascaded amplifiers operate to reduce the input-referred offset voltage arising from the device mismatch in regenerative latch circuit B1. FIG. 3 shows a typical implementation of a prior art differential amplifier together with the NMOS reset switches which connect the inputs and outputs together. The amplifier circuit includes differential input NMOS transistors 12A and 12B connected to a tail current source which includes NMOS transistor 10. Diode-connected PMOS transistors 14A and 14B form the load circuit, with NMOS transistors 16A and 16B forming the reset switches.

The open-loop gain of the FIG. 3 amplifier is approximately equal to the ratio of the transconductance (gm) of the NMOS input transistors 12A/12B to the transconductance of the PMOS load transistors. Thus, the gain can be expressed as follows:

$$G = gm_I / gm_L \quad (1)$$

where G is the amplifier gain, $gm_I$ is the transconductance of the input transistors 12A/12B and $gm_L$ is the transconductance of the load transistors 14A/14B.

Since transistors 12A/12B and 14A/14B all operate in the saturation region, the transconductance of these transistors can be expressed as follows:

$$gm = 2I_{DS}/(V_{GS}-V_t) \quad (2)$$

where $I_{DS}$ is the drain-source current, $V_{GS}$ is the gate-source voltage and $V_t$ is the transistor threshold voltage.

Combining equations (1) and (2), the amplifier gain can be expressed as follows:

$$G = (V_{GSL}-V_{tL})/(V_{GSI}-V_{tI}) \quad (3)$$

where $V_{GSL}$ and $V_{GSI}$ are the gate-source voltage of transistors 14A/14B and 12A/12B, respectively, and $v_{tL}$ and $V_{tI}$ are the threshold voltages of transistors 14A/14B and 12A/12B, respectively.

The numerator and denominator of equation (3) are each sometimes referred to as the gate drive voltage, that is, the degree to which the gate-source voltage exceeds the threshold voltage. The gain G can be considered to be approximately equal to the ratio of the gate drive voltage of the load transistors 14A/14B to the gate drive voltage of the input transistors 12A/12B.

In a typical configuration, the gate drive voltage of the input transistors 12A and 12B has a practical minimum value of 150–200 mV in order to preserve a reasonable input capacitance. The maximum gate drive of the load transistors 14A and 14B is limited by the magnitude of the supply voltage VDD. A supply voltage VDD of +5 volts typically supports a gain of about 7–10 for the FIG. 3 circuit.

For CMOS processes where the magnitude of the threshold voltage Vt for the NMOS and PMOS transistors is about 0.75 volts, the FIG. 3 amplifier topology is unsuitable for operation at significantly lower supply voltages VDD, such as +2.7 volts. There is a need for an amplifier design that is suitable for comparator circuit and other applications capable of operating at reduced supply voltages. As will become apparent to those skilled in the art upon a reading of the following Detailed Description of the Invention together with the drawings, the present invention addresses this shortcoming of the prior art by providing an amplifier capable of good performance at reduced supply voltages.

SUMMARY OF THE INVENTION

A differential amplifier and related method are disclosed. The amplifier includes first and second MOS transistors, typically NMOS transistors, having their respective sources coupled to a tail current source. The gates of the first and second MOS transistors function as the differential input to the amplifier.

Third and fourth MOS transistors, typically PMOS transistors, are connected as loads, with the third load transistor and the first input transistor having their respective drain-source paths connected in series to form a first current path and with the fourth load transistor and the second input transistor having their respective drain-source paths connected in series to form a second current path. Biasing circuitry is provided to cause the load transistors to operate in the linear region of operation as opposed to the saturation region of operation. This feature increases the gain of the amplifier at low voltage operation.

BRIEF DESCRIPTION OF THE DRAWINGS

FIG. 1 is a circuit diagram of a conventional multistage offset cancelling comparator circuit of the type suitable for incorporating amplifiers in accordance with the present invention.

FIGS. 2A–2E are timing diagrams for the various signals used to control the operation of the FIG. 1 comparator circuit.

DETAILED DESCRIPTION OF THE INVENTION

Figure 4:
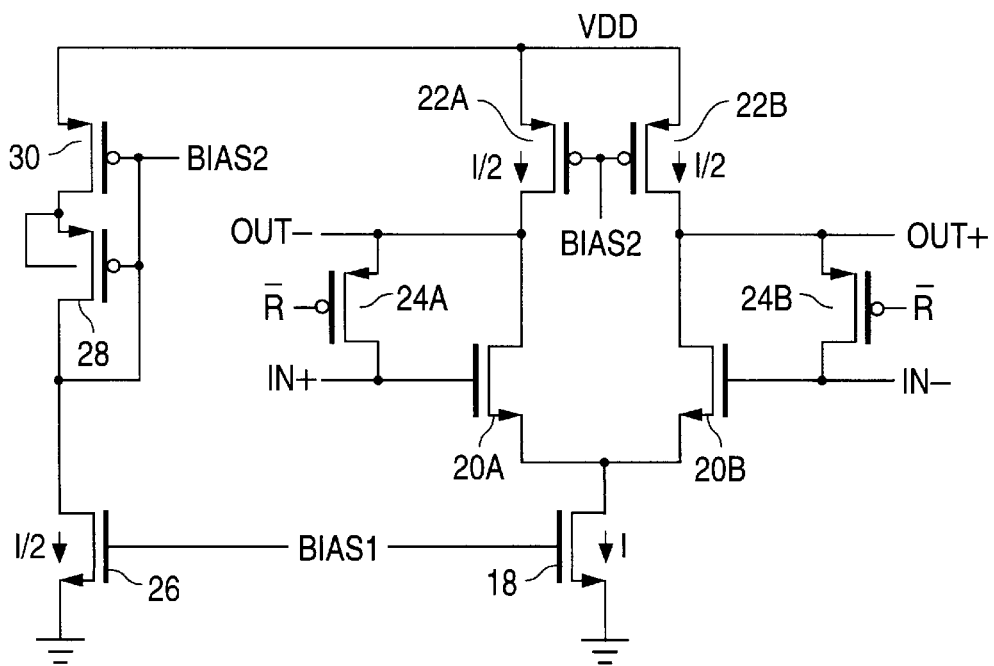
FIG. 4 is a circuit diagram of a first embodiment of an amplifier in accordance with the present invention.

Referring again to the Drawings, FIG. 4 depicts an amplifier in accordance with one embodiment of the present invention. It should be noted that the terms MOS, PMOS and NMOS are intended to encompass, in the present application, all types of field effect transistors (FETs) as opposed to bipolar transistors. By way of example, a PMOS transistor would include all types of PFETs including PMOS and PJFET devices. The amplifier includes NMOS transistors 20A and 20B which form a differential pair, having common source connections to a tail current source comprising transistor 18 which produces an output current I. The load transistors 22A and 22B are PMOS devices having their gates connected to a common bias voltage BIAS2. The load transistors 22A and 22B are biased to operate in the linear region rather than the saturation region.

The gain of the FIG. 4 circuit can be expressed as follows:

$$G = gm_I / gds_L \quad (4)$$

where $gm_I$ is the transconductance of input transistors 20A/20B and $gds_L$ is the drain-source conductance of the load transistors 22A/22B operating in the linear region.

Assuming that the load transistors 22A/22B are operating well within the linear region, $gds_L$ can be approximated as the drain-source current $I_{DS}$ divided by the drain-source voltage $V_{DS}$. Setting $gds_L$ equal to $I_{DSL}/V_{DSL}$ in equation (4) and setting $gm_I$ equal to $2I_{DSI}/(V_{GSI}-V_{tI})$, and assuming that $I_{DSL}$ and $I_{DSI}$ are equal, the gain of the FIG. 4 amplifier can be expressed as follows:

$$G = 2V_{DSL}/(V_{GSI}-V_{tI}) \quad (5)$$

Comparing the gain expression of equation (5) of the present invention with equation (3) of the prior art amplifier, it can be seen that a gain comparable or higher that the prior art amplifier can be achieved at a much lower supply voltage. This improvement is attributable to the factor of 2 in the gain as shown in equation (5). It is also attributable to the fact that the threshold voltage of the PMOS load transistors 22A and 22B does not reduce the headroom as it does in the FIG. 3 circuit.

Figure 3:
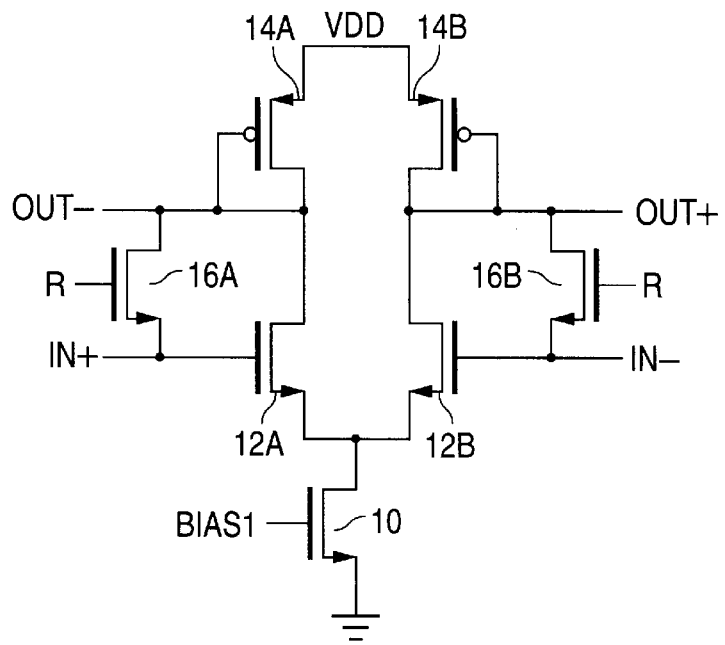
FIG. 3 is a circuit diagram of a conventional amplifier used on the FIG. 1 comparator circuit.

Note that the reset switches 24A and 24B of the FIG. 4 amplifier are PMOS devices as opposed to the NMOS devices used in the prior art circuit of FIG. 3. Thus, the control signals R bar must be of the opposite polarity. PMOS switches are used because the drain-source voltage $V_{DS}$ of the load transistors 22A and 22B must be kept relatively low to maintain the transistors well inside the linear region. Typically, the drains of transistors 22A and 22B must be fairly close to the supply voltage VDD, about 0.5 volts, thereby requiring the reset switches 24A and 24B to be PMOS devices.

The circuitry for producing bias voltage BIAS2 for biasing the load transistors 22A and 22B in the linear region includes a PMOS transistor 30 which is matched to transistors 22A and 22B. A transistor 26, having a channel width to length ratio W/L one-half that of transistor 18, has a gate connected to the same bias voltage, BIAS1, that is connected to the gate of tail current source transistor 18. Thus, transistor 26 will conduct one-half the current of transistor 18 and transistor 30 will conduct the same current as transistors 22A and 22B. A diode-connected PMOS transistor 28 is connected between the gate and drain of transistor 30 and reduces the drain-source voltage of transistor 30 thereby forcing transistor 30 to operate in the linear region. When transistor 28 is sized correctly and assuming that the differential input voltage is zero, transistors 30, 22A and 22B will remain in the linear region and have approximately the same drain-source voltage over process, supply voltage variations and temperature variations so that the gain will remain well controlled.

Figure 5:
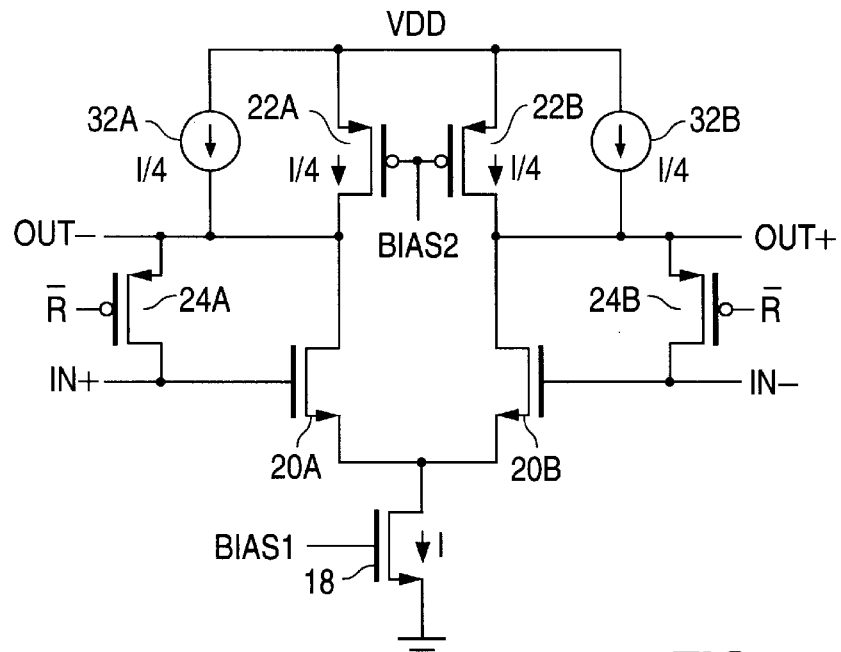
FIG. 5 is a circuit diagram of a second embodiment of an amplifier in accordance with the present invention.

FIG. 5 illustrates one possible enhancement to the FIG. 4 amplifier. The channel widths of the PMOS load transistors 22A and 22B are reduced by ½ so that the drain-source current $I_{DSL}$ will be reduced by the same amount. Current sources 32A and 32B are connected in parallel with the load transistors so that the original current level $I_{DS}/2$ is maintained in the input transistors 20A and 20B, namely, one-half of the $I_{DS}$ of transistor 18. The tail current source which includes transistor 18 will continue to produce a current I. Thus, setting $gds_L$ equal to $I/4V_{DSL}$ in equation (4) and setting $gm_I$ equal to $I/(V_{GSI}-V_{tI})$ the gain of the FIG. 5 amplifier can be expressed as follows:

$$G = 4V_{DSL}/(V_{GSI}-V_{tI}) \quad (6)$$

As can be seen by comparing equations (5) and (6), the gain G has doubled. Gain increases other than by 2 can be achieved by reducing the size of the PMOS transistors 22A and 22B and the magnitude of $I_{DSL}$ by amounts other than a factor of 2.

Figure 6:
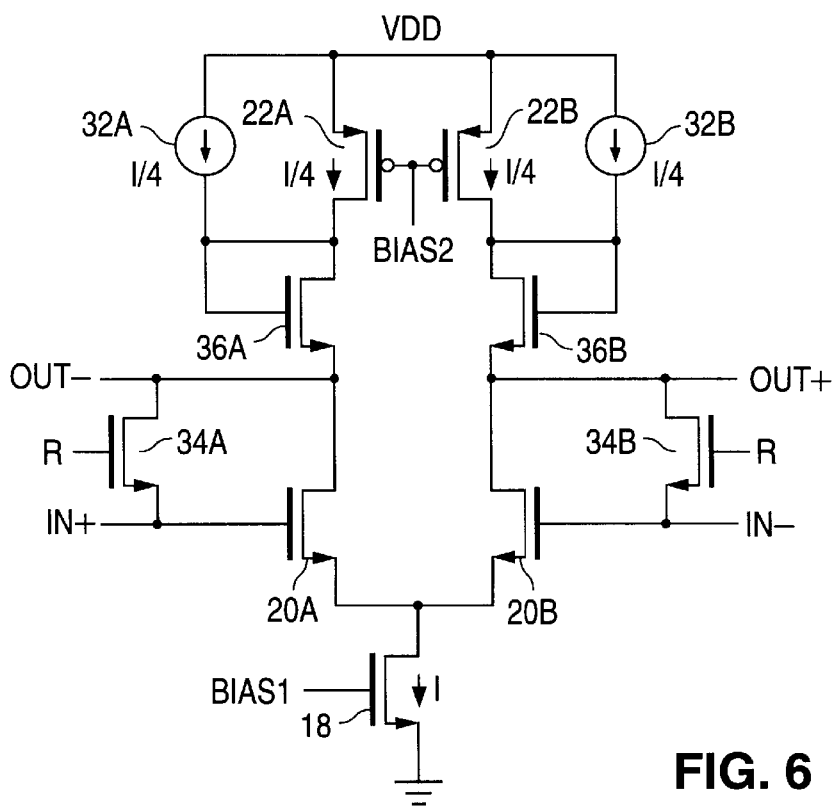
FIG. 6 is a circuit diagram of a third embodiment of an amplifier in accordance with the present invention.

One drawback to the use of PMOS reset transistors 24A and 24B of FIGS. 4 and 5 is due to the fact that PMOS transistors inject approximately 3 to 4 times more charge when they are opened as compared to NMOS transistors since the PMOS transistors must be approximately 3 to 4 times as large as the NMOS transistors in order to produce the same on resistance. FIG. 6 is an enhancement of the FIG. 5 circuit which addresses this drawback. Diode connected NMOS transistors 36A and 36B are connected in series with the load transistors 22A and 22B. This reduces the common-mode input and output voltages of the amplifier from about 0.5 volts below supply VDD to about VDD/2. At this reduced voltage, it is possible to use NMOS transistors 34A and 34B as the reset switches rather than PMOS devices.

Centering the common-mode input and output voltages provides a further advantage over the amplifiers of FIGS. 4 and 5. When the comparator circuit, such as shown in FIG. 1, is driven by a differential input (IN+ and IN−) which is significantly different from the differential reference voltage (Ref+ and Ref−), the amplifier inputs will be driven widely apart. If the common-mode voltage is near the supply voltage, as is the case of the FIGS. 4 and 5 amplifiers, one of the amplifier inputs will be boosted well above the supply voltage VDD. This could potentially cause the drain of the PMOS reset transistors 24A and 24B of the FIGS. 4 and 5 circuits to become forward biased relative to the n-well in which the drains are disposed. Centering the common-mode input voltage between supply VDD and ground provides the maximum allowable swing (in both directions) for the amplifier inputs.

The diode-connected NMOS transistors 36A and 36B reduce the headroom available for the NMOS differential pair 20A and 20B and tail current source transistor 18. By minimizing the voltage drop across the diode-connected NMOS transistors 36A and 36B through the use of large ratio of channel width to length, robust operation can be achieved over process and temperature corners for a minimum supply voltage $V_{DD}$ as low as +2.7 volts.

Figure 7:
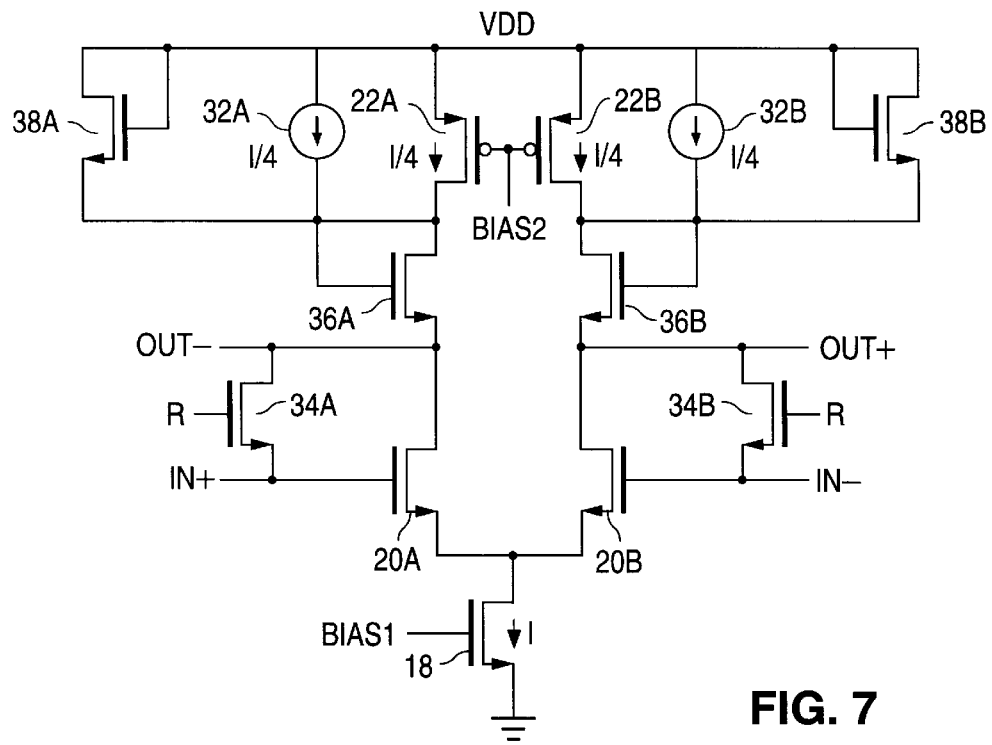
FIG. 7 is a circuit diagram of a fourth embodiment of an amplifier in accordance with the present invention.

FIG. 7 depicts an enhancement of the amplifier circuit of FIG. 6. Diode-connected NMOS transistors 38A and 38B are connected in parallel with load transistors 22A and 22B. Transistors 38A and 38B act as clamps to reduce the maximum output voltage swing thereby decreasing the time needed to reset the amplifier and limiting the signal amplitude presented to the next element in the signal path. NMOS clamps are used because their parasitic capacitance is about three to four times lower compared to PMOS clamps with the same clamp resistance. Simulation has verified that clamp transistors 38A and 38B remain off until a very large differential output voltage is developed.

Figure 8:
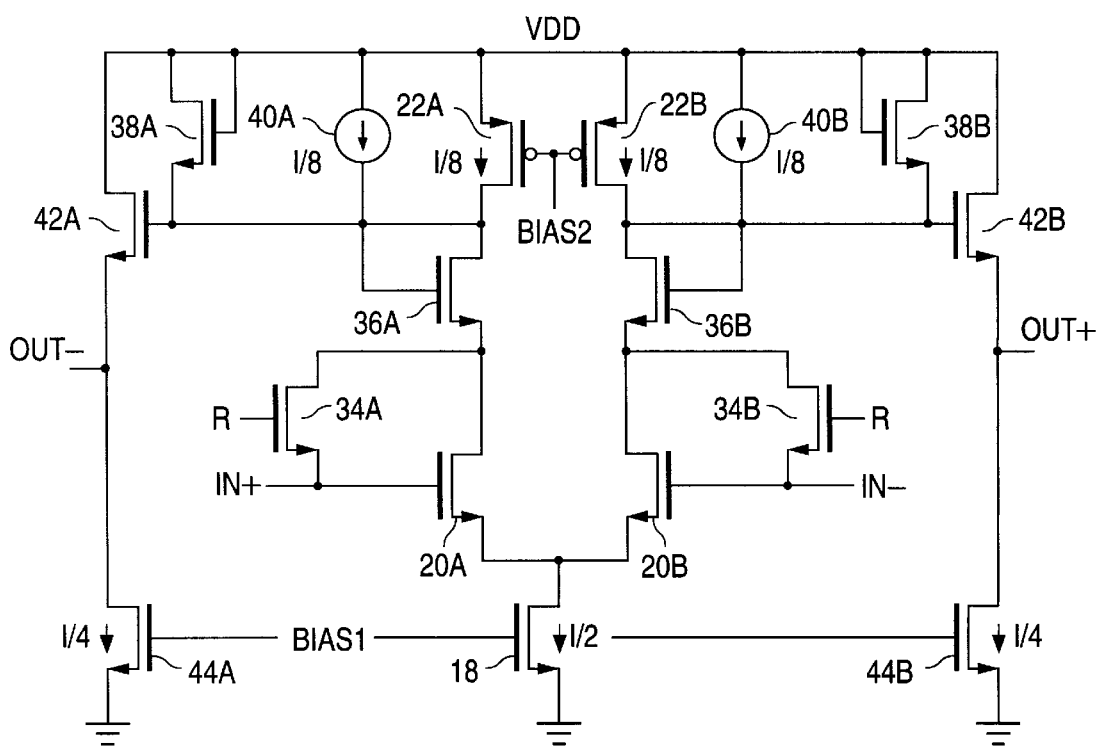
FIG. 8 is a circuit diagram of a fifth embodiment of an amplifier in accordance with the present invention.

A still further embodiment of the subject invention is shown in FIG. 8. Each output of the internal differential amplifier stage drives a source follower stage, with one stage including output transistor 42A connected to a current source transistor 44A and the second stage including output transistor 42B connected to a current source transistor 44B. The source follower output buffers increase the open loop bandwidth of the amplifier by about 30%. The currents and device widths of the basic amplifier circuit have been scaled by 50%. Thus, an increase in bandwidth is achieved without an increase in power consumption as compared to the FIG. 7 circuit.

Note that the reset transistors 34A and 34B are no longer connected directly between the output and the input of the FIG. 8 circuit. If the switches were connected directly between the inputs and outputs, there would be excessive loop delay during reset, resulting in instability. Note also that the equal sharing of current between the input and output stages of the FIG. 8 circuit approximately optimizes the tradeoff between resetting speed, which is determined by the input stage current, and open loop bandwidth, which is predominately determined by the output stage current. Thus, the FIG. 8 amplifier combines improved open-loop bandwidth with all of the advantages previously noted with respect to the amplifiers of FIGS. 3–7, including a well controlled gain at low voltage, NMOS reset switches, a mid-supply common-mode input voltage and output swing clamps.

In conclusion, various embodiments of an improved differential amplifier have been disclosed. Although these embodiments have been described in some detail, it is to be understood that certain changes can be made by those skilled in the art without departing from the spirit and scope of the invention as defined by the appended claims.

What is claimed is:

1. A differential amplifier comprising:
   first and second MOS transistors of a first conductivity type having respective gates which form an amplifier input;
   a tail current source coupled to sources of the first and second MOS transistors;
   a third MOS transistor of a second conductivity type opposite the first conductivity type, with the first and third transistors each defining drain-source current paths connected in series to form a first current path, with a node intermediate the first and third transistors along the first current path forming a first amplifier output;
   a fourth MOS transistor of the second conductivity type, with the second and fourth transistors each defining drain-source current paths connected in series to form a second current path, with a node intermediate the second and fourth transistors along the second current path forming a second amplifier output;
   a bias circuit coupled to the third and fourth MOS transistors and configured to maintain the third and fourth transistors in a linear region of operation.

2. The amplifier of claim 1 further including a reset MOS transistor coupled between the gate of the first MOS transistor and the first amplifier output and another reset MOS transistor coupled between the gate of the second MOS transistor and the second amplifier output.

3. The amplifier of claim 2 wherein the first and second conductivity types are NMOS and PMOS, respectively.

4. The amplifier of claim 3 wherein the reset transistors are PMOS transistors.

5. The amplifier of claim 1 wherein the biasing circuitry includes a fifth MOS transistor of the second conductivity type biased to operate in the linear region and wherein a gate of the fifth MOS transistor is coupled to gates of the third and fourth MOS transistors.

6. The amplifier of claim 5 wherein the third and fourth transistors operate with a ratio of drain-source current to W/L which is approximately equal to -the ratio of drain-source current to W/L as the fifth MOS transistor, with W/L being the ratio of transistor channel width to length.

7. The amplifier of claim 1 wherein the tail current source provides an output current I, with the third and fourth MOS transistor operating with a drains-source currents which total less than I.

8. The amplifier of claim 7 further including a first current source connected in parallel with the third MOS transistor so that current flow through the first MOS transistor is a sum of the first current source output and the drain-source current of the third MOS transistor and including a second current source connected in parallel with the fourth MOS transistor so that current flow through the second MOS transistor is a sum of the second current source output and the drain-source current of the fourth MOS transistor.

9. The amplifier of claim 8 wherein the first and second current sources outputs have a magnitude equal to I/4.

10. The amplifier circuit of claim 2 further including a first voltage dropping element positioned in the first current path intermediate the third MOS transistor and the first output and a second voltage dropping element positioned in the second current path intermediate the fourth MOS transistor and the second output.

11. The amplifier circuit of claim 10 wherein the first and second voltage dropping elements each include a diode-connected MOS transistor.

12. The amplifier circuit of claim 11 wherein the reset transistors are NMOS transistors.

13. The amplifier circuit of claim 1 further including a first clamping circuit connected in parallel with the third MOS transistor and a second clamping circuit connected in parallel with the fourth MOS transistor.

14. The amplifier circuit of claim 13 wherein the first and second clamping circuit each include a diode-connected MOS transistor connected to a power supply rail for the amplifier.

15. The amplifier circuit of claim 1 further including a first buffer stage having an input coupled to the first amplifier output of the amplifier to provide a first buffered output and a second buffer stage having an input coupled to the second amplifier output of the amplifier to provide a second buffered output.

16. The amplifier of claim 15 further including a reset MOS transistor coupled between the first amplifier input and a node on the first current path intermediate the first and third MOS transistors and another reset transistor coupled between the second amplifier input and a node on the second current path intermediate the second and fourth MOS transistors.

17. A differential amplifier comprising:
    first and second MOS transistors of a first conductivity type having respective gates which form an amplifier input;
    a tail current source coupled to sources of the first and second MOS transistors;
    a third MOS transistor of a second conductivity type opposite the first conductivity type, with the first and third transistors each defining drain-source current paths connected in series to form a first current path;
    a fourth MOS transistor of the second conductivity type, with the second and fourth transistors each defining drain-source current paths connected in series to form a second current path;
    a bias circuit coupled to the third and fourth MOS transistors and configured to maintain the third and fourth transistors in a linear region of operation;
    a first buffer stage having an input coupled to a node on the first current path intermediate the first and third MOS transistors and an output which form a first amplifier output; and
    a second buffer stage having an input coupled to a node on the second current path intermediate the second and fourth MOS transistors and an output which form a second amplifier output.

18. The amplifier of claim 17 wherein the tail current source provides an output current I, with the third and fourth MOS transistor operating with drains-source currents which total less than I.

19. The amplifier of claim 18 further including a first current source connected in parallel with the third MOS transistor so that current flow through the first MOS transistor is a sum of the first current source output and the drain-source current of the third MOS transistor and including a second current source connected in parallel with the fourth MOS transistor so that current flow through the second MOS transistor is a sum of the second current source output and the drain-source current of the fourth MOS transistor.

20. The amplifier circuit of claim 19 further including a reset MOS transistor coupled between the gate of the first MOS transistor and a node on the first current path intermediate the first and third MOS transistors and another reset MOS transistor coupled between the gate of the second MOS transistor and a node on the second current path intermediate the second and fourth MOS transistors.

21. The amplifier circuit of claim 20 further including a first voltage dropping element positioned in the first current path intermediate the first and third MOS transistors and a second voltage dropping element positioned in the second current path intermediate the second and fourth MOS transistors.

22. The amplifier circuit of claim 21 wherein the first and second voltage dropping elements each include a diode-connected MOS transistor.

23. The amplifier circuit of claim 21 wherein the 6reset transistor is coupled between the gate of the first MOS transistor and a node on the first current path intermediate the first transistor and the first voltage dropping element and the another reset transistor is coupled between the gate of the second MOS transistor and a node on the second current path intermediate the second transistor and the second voltage dropping element.

24. The amplifier circuit of claim 23 wherein the reset transistors are NMOS transistors.

25. A differential amplifier comprising:
    first and second NMOS transistors having respective gates which form an amplifier input;
    a tail current source coupled to sources of the first and second NMOS transistors;
    a first PMOS transistor, with the first NMOS and first PMOS transistors each defining drain-source current paths connected in series to form a first current path;
    a second PMOS transistor, with the second NMOS and the second PMOS transistors each defining drain-source current paths connected in series to form a second current path;
    a first voltage dropping element in series with the first current path intermediate the first NMOS and the first PMOS transistors;
    a second voltage dropping element in series with the second current path intermediate the second NMOS and the second PMOS transistors;
    a first NMOS reset transistor coupled between the gate of the first NMOS transistor and a node of the first current path intermediate the first NMOS transistor and the first voltage dropping element;
    a second NMOS reset transistor coupled between the gate of the second NMOS transistor and a node of the second current path intermediate the second NMOS transistor and the second voltage dropping element; and
    a bias circuit coupled to the first and second PMOS transistors and configured to maintain the first and second PMOS transistors in a linear region of operation.

26. The amplifier of claim 25 wherein the first and second voltage dropping elements each comprise an NMOS transistor.

27. The amplifier of claim 25 wherein the tail current source provides an output current I, with the first and second PMOS transistor operating with drains-source currents which total less than I.

28. The amplifier of claim 27 further including a first current source connected in parallel with the first PMOS transistor so that current flow through the first NMOS transistor is a sum of the first current source output and the drain-source current of the first PMOS transistor and including a second current source connected in parallel with the second PMOS transistor so that current flow through the second NMOS transistor is a sum of the second current source output and the drain-source current of the second PMOS transistor.

29. The amplifier circuit of claim 28 further including a first clamping circuit connected in parallel with the first PMOS transistor and a second clamping circuit connected in parallel with the second PMOS transistor.

30. The amplifier circuit of claim 29 wherein the first and second clamping circuits each include a diode-connected NMOS transistor connected to a power supply rail for the amplifier.

31. The amplifier circuit of claim 30 further including a first buffer stage having an input coupled to a node along the first current path intermediate the first NMOS transistor and the first PMOS transistor to provide a first buffered output and a second buffer stage having an input coupled to and node along the second current path intermediate the second NMOS transistor and the second PMOS transistor.

32. The amplifier circuit of claim 31 wherein the first and second buffer stages each include an MOS transistor connected in a source follower configuration.

* * * * *